(12) United States Patent
Tanaka et al.

(10) Patent No.: US 10,665,508 B2
(45) Date of Patent: May 26, 2020

(54) CUTTING APPARATUS AND GROOVE DETECTING METHOD

(71) Applicant: DISCO CORPORATION, Tokyo (JP)

(72) Inventors: Makoto Tanaka, Tokyo (JP); Shinya Yasuda, Tokyo (JP); Satoshi Hanajima, Tokyo (JP); Harunobu Yuzawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/103,074

(22) Filed: Aug. 14, 2018

(65) Prior Publication Data

US 2019/0067108 A1 Feb. 28, 2019

(30) Foreign Application Priority Data

Aug. 22, 2017 (JP) ................. 2017-159589

(51) Int. Cl.
| | |
|---|---|
| *H01L 21/78* | (2006.01) |
| *B28D 5/00* | (2006.01) |
| *B23K 26/364* | (2014.01) |
| *H01L 21/687* | (2006.01) |
| *B23K 26/04* | (2014.01) |
| *H01L 21/66* | (2006.01) |
| *H01L 21/67* | (2006.01) |
| *H01L 21/68* | (2006.01) |

(52) U.S. Cl.
CPC ............ *H01L 21/78* (2013.01); *B23K 26/043* (2013.01); *B23K 26/364* (2015.10); *B28D 5/0011* (2013.01); *B28D 5/0052* (2013.01); *B28D 5/0058* (2013.01); *H01L 21/68728* (2013.01); *H01L 22/00* (2013.01); *H01L 21/67092* (2013.01); *H01L 21/67253* (2013.01); *H01L 21/67259* (2013.01); *H01L 21/681* (2013.01)

(58) Field of Classification Search
CPC . H01L 21/78; H01L 21/68728; B23K 26/364; B23K 26/043; B28D 5/0011; B28D 5/0052; B28D 5/0058
See application file for complete search history.

(56) References Cited

U.S. PATENT DOCUMENTS 5,011,282 A * 4/1991 Ream .................. B23K 26/043
219/121.78
6,580,054 B1 * 6/2003 Liu ...................... B23K 26/032
219/121.68

(Continued)

FOREIGN PATENT DOCUMENTS

JP 10149705 A 6/1998
JP 2010010445 A 1/2010

*Primary Examiner* — Omar Flores Sanchez
(74) *Attorney, Agent, or Firm* — Greer Burns & Crain, Ltd.

(57) ABSTRACT

A cutting apparatus includes a cutting unit configured to cut a workpiece held on a chuck table, and a groove detecting unit including a CCD imaging element photographing the workpiece held on the chuck table. The groove detecting unit photographs, by the CCD imaging element, a laser-processed groove and a cut groove illuminated by an oblique illumination set such that a light amount of light in a direction parallel with an extending direction of the laser-processed groove as viewed in plan is higher than a light amount of light in a direction orthogonal to the extending direction of the laser-processed groove.

4 Claims, 9 Drawing Sheets

(56) References Cited

U.S. PATENT DOCUMENTS

| | | | |
|---|---|---|---|
| 2006/0217688 A1* | 9/2006 | Lai | A61F 9/00804 |
| | | | 606/4 |
| 2018/0236608 A1* | 8/2018 | Okuma | B23K 26/53 |
| 2018/0311762 A1* | 11/2018 | Van Der Stam | B23K 26/032 |
| 2018/0330972 A1* | 11/2018 | Shigematsu | H01L 21/67132 |
| 2019/0067108 A1* | 2/2019 | Tanaka | H01L 21/78 |
| 2019/0084089 A1* | 3/2019 | Igasaki | B23K 26/705 |

* cited by examiner

CUTTING APPARATUS AND GROOVE DETECTING METHOD

BACKGROUND OF THE INVENTION

Field of the Invention

The present invention relates to a cutting apparatus and a groove detecting method.

Description of the Related Art

A semiconductor wafer is produced in which semiconductor devices are formed by a functional layer obtained by laminating, on the top surface of a substrate such as silicon or the like, a low dielectric constant insulator film (Low-k film) formed of an inorganic material-based film such as SiOF, BSG (SiOB), or the like, or an organic material-based film as a polymer film having a polyimide base, a parylene base, or the like, in order to improve the processing power of semiconductor chips such as integrated circuits (ICs), large scale integrations (LSIs), or the like.

When the semiconductor wafer is divided, because cutting the Low-k film by a cutting blade causes film peeling, the Low-k film is removed along a street by ablation processing that applies a laser beam of a wavelength absorbable by the Low-k film and the wafer. A laser-processed groove is consequently formed in the semiconductor wafer. Then, when the semiconductor wafer is divided, the inside of the laser-processed groove is cut by a cutting blade, and the semiconductor wafer is divided into each individual device chip without film peeling.

When the semiconductor wafer is divided, cutting a position off the laser-processed groove causes film peeling. It is therefore necessary to detect the position of the laser-processed groove and the position of a formed cut groove as needed, and recognize occurrence of a positional displacement therebetween (see for example Japanese Patent Laid-Open No. Hei 10-149705 and Japanese Patent Laid-Open No. 2010-10445).

SUMMARY OF THE INVENTION

However, while methods depicted in Japanese Patent Laid-Open No. Hei 10-149705 and Japanese Patent Laid-Open No. 2010-10445 detect the positions of the laser-processed groove and the cut groove before cutting processing or during the cutting processing, the methods have difficulty in detecting each of the grooves so as to distinguish the grooves from each other.

Accordingly, it is an object of the present invention to provide a cutting apparatus and a groove detecting method that can suppress detection of a laser-processed groove and a cut groove in a confused manner.

In accordance with an aspect of the present invention, there is provided a cutting apparatus for forming, along a laser-processed groove formed in a top surface of a workpiece by a laser beam irradiating the workpiece, a cut groove in a position overlapping the laser-processed groove. The cutting apparatus includes a cutting unit configured to cut the workpiece held on a chuck table by a cutting blade mounted on a spindle, and a groove detecting unit including a camera photographing the workpiece held on the chuck table. The groove detecting unit photographs, by the camera, the laser-processed groove and the cut groove formed so as to overlap the laser-processed groove, the laser-processed groove and the cut groove being illuminated by an oblique illumination set such that a light amount of light in a direction parallel with an extending direction of the laser-processed groove as viewed in plan is higher than a light amount of light in a direction orthogonal to the extending direction of the laser-processed groove, and detects, from a photographed image, the laser-processed groove displayed brightly with the light diffusely reflected by projections and depressions of a groove bottom of the laser-processed groove as well as the cut groove displayed more darkly than the laser-processed groove with the light regularly reflected by a groove bottom of the cut groove.

In the cutting apparatus, the oblique illumination may be a ring illumination set annularly around an outer circumference of a condensing lens included in the camera, and may have an illumination direction selecting function so as to apply light from the direction parallel with the extending direction of the laser-processed groove as viewed in plan.

In addition, according to another aspect of the present invention, there is provided a groove detecting method for detecting a laser-processed groove formed in a top surface of a workpiece by irradiating the workpiece with a laser beam. The groove detecting method includes an illuminating step of holding, by a chuck table, the workpiece in which the laser-processed groove is formed, and illuminating the laser-processed groove with an oblique illumination performing irradiation from a direction parallel with an extending direction of the laser-processed groove as viewed in plan, and a groove detecting step of photographing the illuminated laser-processed groove by a camera, and detecting the laser-processed groove diffusely reflecting light of the oblique illumination by projections and depressions of a groove bottom of the laser-processed groove from a photographed image obtained by the photographing.

In the groove detecting method, in the groove detecting step, a cut groove formed along the laser-processed groove and in a position overlapping the laser-processed groove may be photographed, and the cut groove regularly reflecting the light of the oblique illumination by a groove bottom of the cut groove may be detected.

The cutting apparatus and the groove detecting method according to the invention of the present application produce an effect of being able to suppress detection of a laser-processed groove and a cut groove in a confused manner.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Modes (embodiments) for carrying out the present invention will be described in detail with reference to the drawings. Contents described in the following embodiments do not limit the present invention. In addition, constituent elements described in the following include constituent elements readily conceivable by those skilled in the art or substantially identical constituent elements. Further, configurations described in the following can be combined with each other as appropriate. In addition, various omissions, replacements, or changes of configurations can be performed without departing from the spirit of the present invention.

First Embodiment

Figure 1:
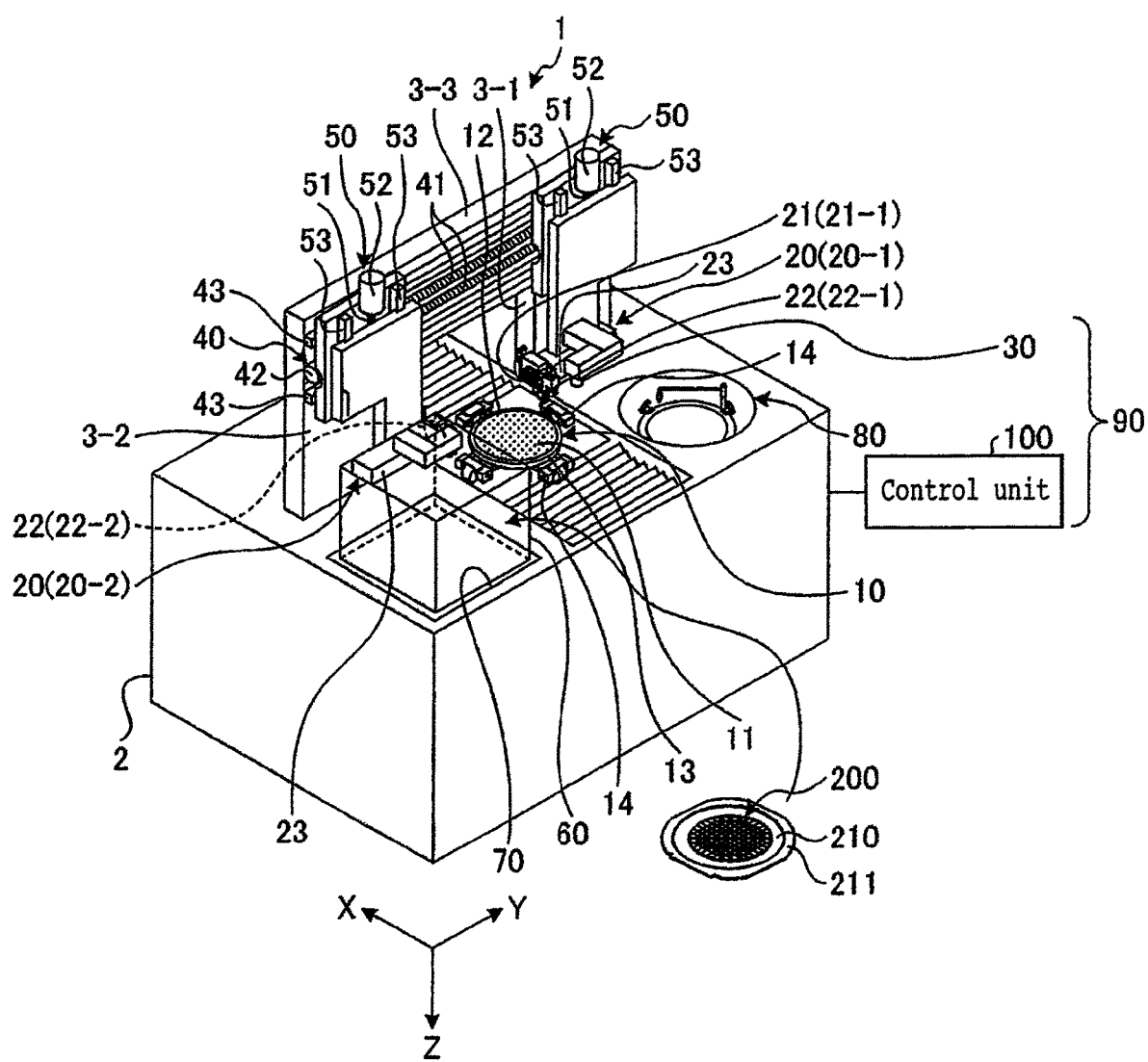
FIG. 1 is a perspective view depicting an example of a configuration of a cutting apparatus according to a first embodiment.
Figure 2:
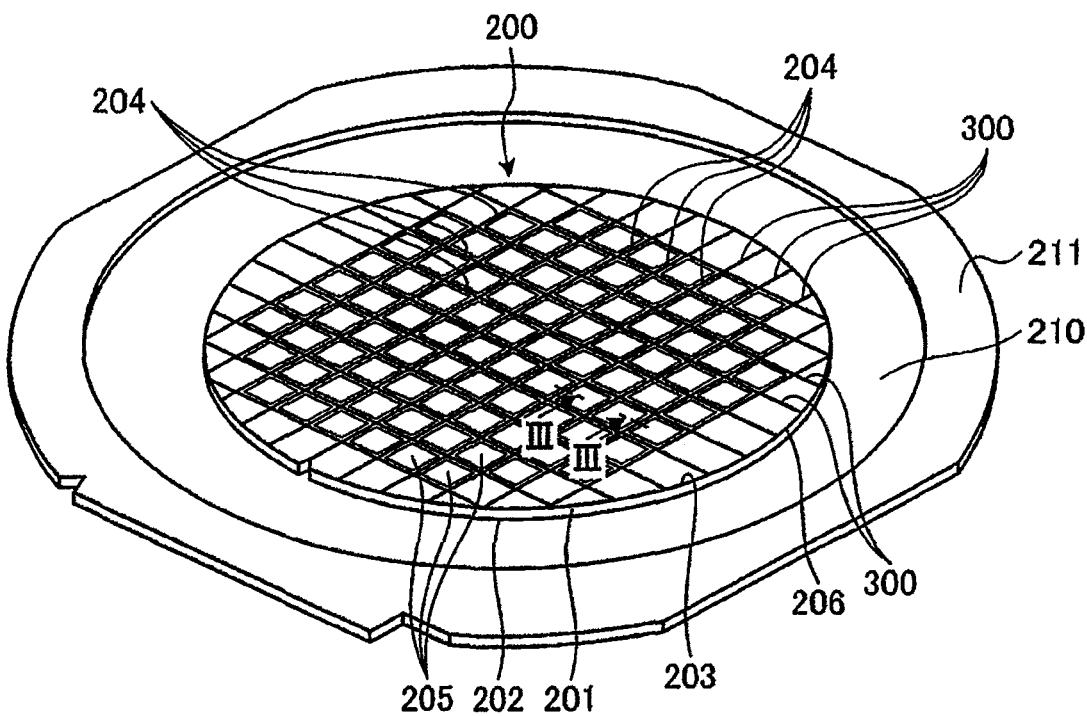
FIG. 2 is a perspective view of a workpiece as a processing target of the cutting apparatus according to the first embodiment.
Figure 3:
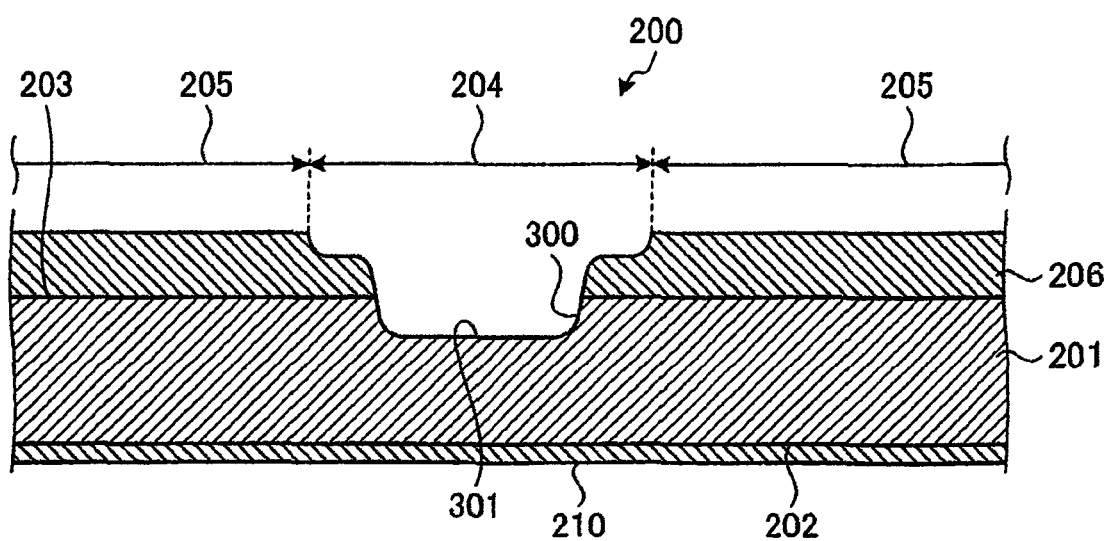
FIG. 3 is a sectional view taken along a line III-III of FIG. 2.
Figure 4:
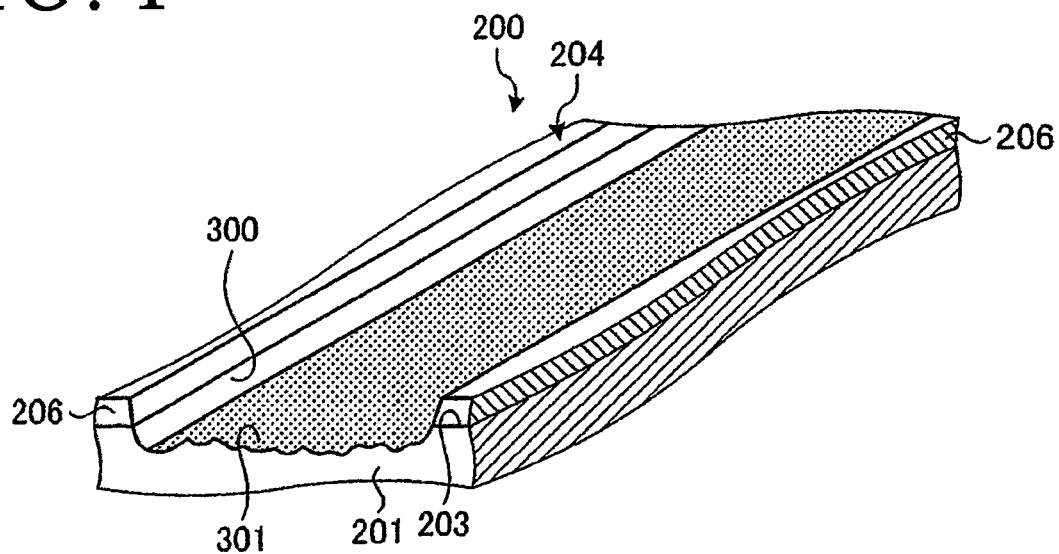
FIG. 4 is a perspective view of a part of the workpiece depicted in FIG. 2.
Figure 5:
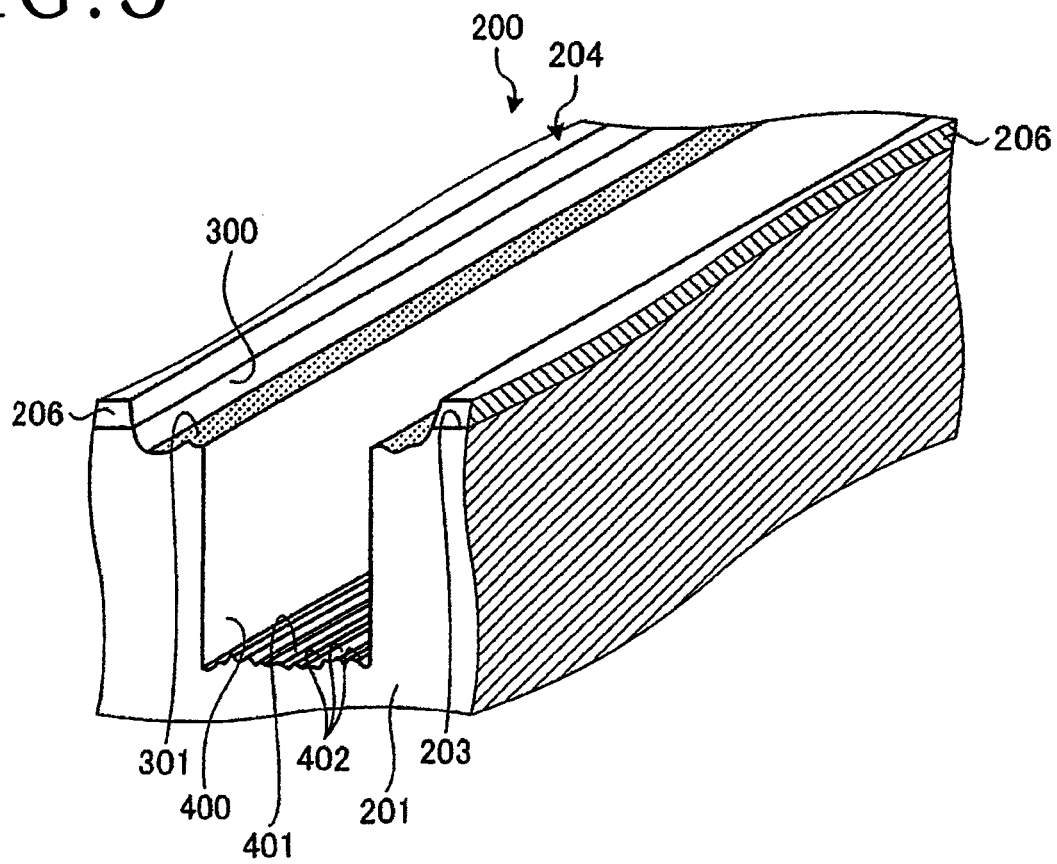
FIG. 5 is a perspective view depicting a state in which a cut groove is formed in a groove bottom of a laser-processed groove of the workpiece depicted in FIG. 4.
Figure 6:
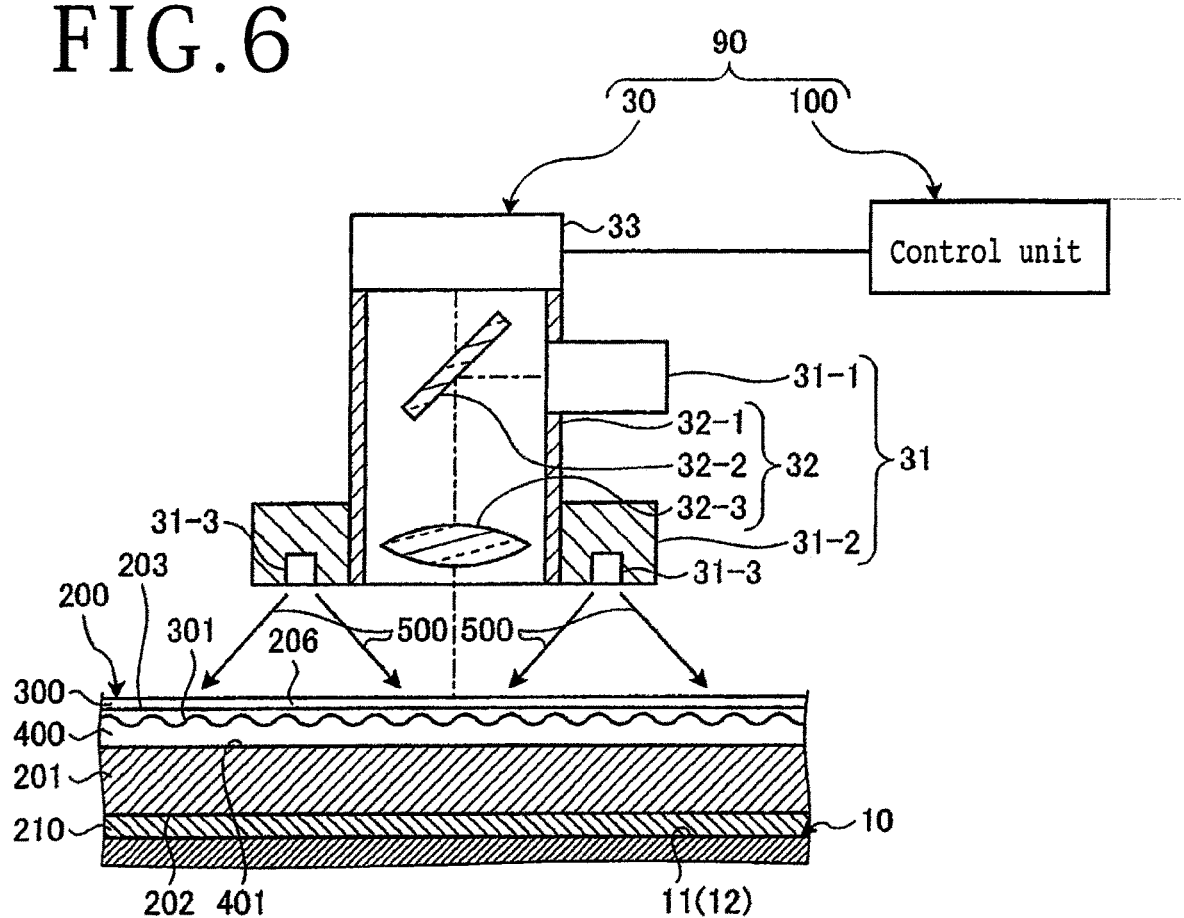
FIG. 6 is a diagram depicting a configuration of a photographing unit of the cutting apparatus depicted in FIG. 1.
Figure 7:
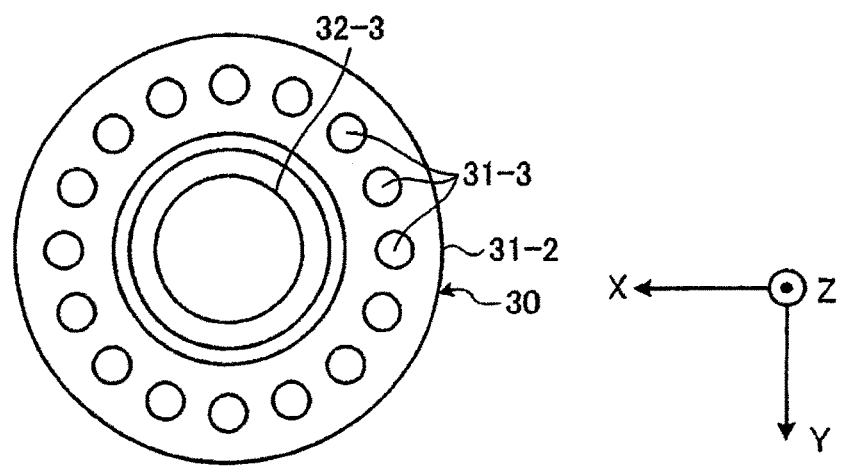
FIG. 7 is a plan view of an oblique illumination of the photographing unit depicted in FIG. 6, the oblique illumination being viewed from an undersurface side.

A cutting apparatus and a groove detecting method according to a first embodiment of the present invention will be described with reference to the drawings. FIG. 1 is a perspective view depicting an example of a configuration of the cutting apparatus according to the first embodiment. FIG. 2 is a perspective view of a workpiece to be processed by the cutting apparatus according to the first embodiment. FIG. 3 is a sectional view taken along a line of FIG. 2. FIG. 4 is a perspective view of a part of the workpiece depicted in FIG. 2. FIG. 5 is a perspective view depicting a state in which a cut groove is formed in a groove bottom of a laser-processed groove of the workpiece depicted in FIG. 4. FIG. 6 is a diagram depicting a configuration of a photographing unit of the cutting apparatus depicted in FIG. 1. FIG. 7 is a plan view of an oblique illumination of the photographing unit depicted in FIG. 6, the oblique illumination being viewed from an undersurface side.

A cutting apparatus 1 according to the first embodiment is an apparatus that cuts (processes) a workpiece 200 depicted in FIG. 2 as a plate-shaped object. In the first embodiment, the workpiece 200 is a semiconductor wafer or an optical device wafer in the shape of a disk, which wafer has silicon, sapphire, gallium, or the like as a substrate 201. As depicted in FIG. 2, the workpiece 200 has devices 205 in regions demarcated in a lattice manner by a plurality of planned dividing lines 204 formed on a top surface 203 of the substrate 201. As depicted in FIG. 3, a low dielectric constant insulator film (referred to also as a Low-k film) 206 is laminated to the top surface 203 of the substrate 201 of the workpiece 200. The low dielectric constant insulator film 206 supports some parts of circuits constituting the devices 205. The low dielectric constant insulator film 206 is formed of an inorganic material-based film such as SiOF, BSG (SiOB), or the like, or an organic material-based film as a polymer film having a polyimide base, a parylene base, or the like.

In the first embodiment, an adhesive tape 210 is affixed to an undersurface 202 of the workpiece 200, and an annular frame 211 is affixed to an outer circumference of the adhesive tape 210. The workpiece 200 is thereby integral with the annular frame 211. The workpiece 200 is subjected to ablation processing by irradiating each of the planned dividing lines 204 with a laser beam of a wavelength absorbable by the low dielectric constant insulator film 206 and the substrate 201. Consequently, as depicted in FIG. 2, FIG. 3, and FIG. 4, the workpiece 200 has a laser-processed groove 300 formed at a center in a width direction of each of the planned dividing lines 204. At a groove bottom 301 of the laser-processed groove 300, the material constituting the substrate 201 and the low dielectric constant insulator film 206 are altered and are in an amorphous form, so that projections and depressions are formed on the groove bottom 301.

The cutting apparatus 1 depicted in FIG. 1 is an apparatus that divides the workpiece 200 into each individual device 205 by forming, along a laser-processed groove 300 formed on the top surface of the workpiece 200 with a laser beam applied to the workpiece 200, a cut groove 400 in a position overlapping the laser-processed groove 300, as depicted in FIG. 5, and forming a division groove not depicted in the figure in a groove bottom 401 of the cut groove 400. Incidentally, the cut groove 400 is desirably formed in a center in a width direction of the groove bottom 301 of the laser-processed groove 300, and the width of the cut groove 400 is narrower than the width of the laser-processed groove 300. Incidentally, saw marks 402 as cutting traces formed along the longitudinal direction of the cut groove 400 are formed on the groove bottom 401 of the cut groove 400. The saw marks 402 are projections or grooves extending along the longitudinal direction of the cut groove 400.

As depicted in FIG. 1, the cutting apparatus 1 includes: a chuck table 10 that sucks and holds the workpiece 200 on a holding surface 11; a cutting unit 20 that cuts the workpiece 200 held on the chuck table 10 by a cutting blade 22 mounted on a spindle 21; and a groove detecting unit 90 including a photographing unit 30 as a camera that photographs the workpiece 200 held on the chuck table 10.

In addition, as depicted in FIG. 1, the cutting apparatus 1 includes at least: an X-axis moving unit not depicted in the figure which moving unit performs processing feed of the chuck table 10 in an X-axis direction parallel with a horizontal direction; a Y-axis moving unit 40 that performs indexing feed of the cutting unit 20 in a Y-axis direction parallel with the horizontal direction and orthogonal to the X-axis direction; and a Z-axis moving unit 50 that performs infeed of the cutting unit 20 in a Z-axis direction parallel with a vertical direction orthogonal to both the X-axis direction and the Y-axis direction. As depicted in FIG. 1, the cutting apparatus 1 is a dicer provided with two cutting units 20, that is, two spindles, or a so-called facing dual type cutting apparatus.

The chuck table 10 has a disk shape provided with a holding portion 12 provided with the holding surface 11 for holding the workpiece 200 and formed of porous ceramic or the like and a ring-shaped frame portion 13 surrounding the holding portion 12. In addition, the chuck table 10 is provided so as to be movable in the X-axis direction by the X-axis moving unit and rotatable about an axis parallel with the Z-axis direction by a rotation-driving source not depicted in the figure. The chuck table 10 is connected to a vacuum suction source not depicted in the figure, and sucks and holds the workpiece 200 by being sucked by the vacuum suction source. In addition, a plurality of clamping units 14 clamping the annular frame 211 are disposed on the periphery of the chuck table 10.

The cutting units 20 have a spindle 21 mounted with a cutting blade 22 that cuts the workpiece 200 held on the chuck table 10. The cutting units 20 are each provided so as to be movable in the Y-axis direction by the Y-axis moving unit 40 with respect to the workpiece 200 held on the chuck table 10, and provided so as to be movable in the Z-axis direction by the Z-axis moving unit 50 with respect to the workpiece 200.

As depicted in FIG. 1, one cutting unit 20 (hereinafter indicated by reference numeral 20-1) is provided to one column portion 3-1 erected from an apparatus main body 2 via the Y-axis moving unit 40, the Z-axis moving unit 50, and the like. As depicted in FIG. 1, the other cutting unit 20 (hereinafter indicated by reference numeral 20-2) is provided to another column portion 3-2 erected from the apparatus main body 2 via the Y-axis moving unit 40, the Z-axis moving unit 50, and the like. Incidentally, upper ends of the column portions 3-1 and 3-2 are coupled to each other by a horizontal beam 3-3. Incidentally, in the present specification, reference numerals 20-1 and 20-2 are written when the two cutting units 20 are distinguished from each other, and reference numeral 20 is written when the two cutting units 20 are not distinguished from each other. In addition, in the present specification, when respective constituent elements of the two cutting units 20 are distinguished from each other, "-1" or "-2" is written at an end of the reference numeral of each constituent element.

The cutting units 20 can position the cutting blades 22 at an arbitrary position of the holding surface 11 of the chuck table 10 by the Y-axis moving unit 40 and the Z-axis moving unit 50. The cutting blades 22 are a very thin cutting grindstone having substantially a ring shape. The spindles 21 cut the workpiece 200 by rotating the cutting blades 22. The spindles 21 are rotatably housed within spindle housings 23. The spindle housings 23 are supported by the Z-axis moving unit 50. The axes of the spindles 21 and the cutting blades 22 of the cutting units 20 are set in parallel with the Y-axis direction. The workpiece 200 is cut by feeding the cutting unit 20 by indexing feed in the Y-axis direction by the Y-axis moving unit 40 and feeding the cutting unit 20 by infeed by the Z-axis moving unit 50, and feeding the chuck table 10 by processing feed in the X-axis direction by the X-axis moving unit.

Incidentally, in the first embodiment, the one cutting unit 20-1 of the cutting apparatus 1 forms a cut groove 400 by making the cutting blade 22-1 having a smaller thickness than the width of a laser-processed groove 300 cut into the groove bottom 301 of the laser-processed groove 300. The other cutting unit 20-2 of the cutting apparatus 1 forms a division groove by making the cutting blade 22-2 having a smaller thickness than the cutting blade 22-1 cut into the groove bottom 401 of the cut groove 400. The workpiece 200 is thereby divided into each individual device 205.

The X-axis moving unit is processing feed means for performing processing feed of the chuck table 10 in the X-axis direction by moving the chuck table 10 in the X-axis direction. The Y-axis moving unit 40 is indexing feed means for performing indexing feed of the cutting unit 20 by moving the cutting unit 20 in the Y-axis direction. The Z-axis moving unit 50 performs infeed of the cutting unit 20 by moving the cutting unit 20 in the Z-axis direction. The X-axis moving unit, the Y-axis moving unit 40, and the Z-axis moving unit 50 are provided with: well-known ball screws 41 and 51 provided so as to be rotatable about axes; well-known pulse motors 42 and 52 that rotate the ball screws 41 and 51 about the axes; and well-known guide rails 43 and 53 that support the chuck table 10 or the cutting unit 20 movably in the X-axis direction, the Y-axis direction, or the Z-axis direction.

In addition, the cutting apparatus 1 includes: a cassette elevator 70 on which a cassette 60 housing the workpiece 200 before and after cutting is mounted and which moves the cassette 60 in the Z-axis direction; a cleaning unit 80 that cleans the workpiece 200 after the cutting; and a conveying unit not depicted in the figure which conveying unit conveys the workpiece 200 between the cassette 60, the chuck table 10, and the cleaning unit 80.

The groove detecting unit 90 includes the photographing unit 30 and a control unit 100. The photographing unit 30 is fixed to the spindle housing 23-1 of the one cutting unit 20-1 so as to move integrally with the one cutting unit 20-1. The photographing unit 30 photographs the top surface of the workpiece 200 held on the chuck table 10. As depicted in FIG. 6, the photographing unit 30 includes an illuminator 31, an optical system 32, and a charge coupled device (CCD) imaging element 33 as a camera that photographs the top surface of the workpiece 200 held on the chuck table 10.

The illuminator 31 is formed by a halogen light source or a light-emitting diode (LED), for example. The illuminator 31 includes a coaxial illumination 31-1 whose amount of light is adjusted by the control unit 100. The coaxial illumination 31-1 emits light toward the optical system 32. The optical system 32 includes: a case 32-1; a half mirror 32-2 that is disposed in an upper part of the case 32-1 and regularly reflects the light emitted by the coaxial illumination 31-1 of the illuminator 31 toward the workpiece 200 held on the chuck table 10 in parallel with the Z-axis direction; and a condensing lens 32-3 provided within the case 32-1 and disposed on a lower side of the half mirror 32-2.

A CCD imaging element 33 is disposed above the half mirror 32-2, and outputs, to the control unit 100, an image obtained by receiving light that is reflected from the workpiece 200 illuminated with the light from the coaxial illumination 31-1 of the illuminator 31 via the half mirror 32-2 and the condensing lens 32-3 and is passed through the condensing lens 32-3 and the half mirror 32-2. The CCD imaging element 33 obtains, as the image, an image for carrying out alignment that aligns the workpiece 200 and the cutting blade 22 with each other.

Incidentally, the light emitted by the coaxial illumination 31-1 and regularly reflected by the half mirror 32-2 is parallel with the optical axis of the condensing lens 32-3. The illuminator 31 also includes an oblique illumination 31-2 that is disposed at a lower end of the case 32-1 and on the periphery of the condensing lens 32-3, and which irradiates the top surface of the workpiece 200 held on the chuck table 10 with light 500. As depicted in FIG. 7, the oblique illumination 31-2 is a ring illumination that includes a plurality of light emitting elements 31-3 arranged at intervals in a circumferential direction with the condensing lens 32-3 in the center of the ring illumination, and which is set annularly around the outer circumference of the condensing lens 32-3. The light emitting elements 31-3 are constituted of LEDs or the like capable of applying the light 500. The oblique illumination 31-2 applies the light 500 from the periphery of the condensing lens 32-3 to the top surface of the workpiece 200 when the CCD imaging element 33 photographs the workpiece 200. The amount of light of each of the light emitting elements 31-3 of the oblique illumination 31-2 is adjusted by the control unit 100. Because the amount of light of each of the light emitting elements 31-3 is adjusted, the oblique illumination 31-2 has an irradiation direction selecting function of irradiating the top surface of the workpiece 200 with the light 500 from a direction parallel with the extending direction of the laser-processed groove 300 as viewed in plan by turning on light emitting elements 31-3 located at both ends in the extending direction of the laser-processed groove 300 among the plurality of light emitting elements 31-3 and turning off light emitting elements 31-3 located at both ends in a direction orthogonal to the laser-processed groove 300 when the CCD imaging element 33 photographs the workpiece 200.

The control unit 100 makes the cutting apparatus 1 perform processing operation on the workpiece 200 by controlling each of the above-described constituent elements of the cutting apparatus 1. Incidentally, the control unit 100 is a computer. The control unit 100 includes an arithmetic processing apparatus having a microprocessor such as a central processing unit (CPU), a storage apparatus having a memory such as a read only memory (ROM) or a random access memory (RAM), and an input-output interface apparatus. The arithmetic processing apparatus of the control unit 100 performs arithmetic processing according to a computer program stored in the storage apparatus, and outputs control signals for controlling the cutting apparatus 1 to the above-described constituent elements of the cutting apparatus 1 via the input-output interface apparatus. In addition, the control unit 100 is connected to a display unit not depicted in the figure which display unit is formed by a liquid crystal display apparatus or the like that displays a state of the processing operation, an image, or the like and an input unit not depicted in the figure which input unit is used when an operator registers processing description information or the like. The input unit is formed by at least one of a touch panel provided to the display unit and an external input apparatus such as a keyboard or the like.

The control unit 100 outputs the image obtained by the CCD imaging element 33 of the photographing unit 30 by imaging to the display unit, and makes the display unit display the image. The control unit 100 makes the photographing unit 30 image the workpiece 200 before the cutting of the workpiece 200, and carries out alignment that aligns the workpiece 200 and the cutting blade 22 with each other on the basis of the image obtained by the imaging of the photographing unit 30. In addition, the control unit 100 carries out a kerf check as a groove detecting method according to the first embodiment, the kerf check detecting the position of the cut groove 400 actually formed with respect to the laser-processed groove 300 in the planned dividing line 204 during the cutting of the workpiece 200, and controls the Y-axis moving unit 40 so that the subsequent cut groove 400 is formed in the center of the width direction of the laser-processed groove 300.

When the control unit 100 carries out the kerf check, the control unit 100 turns on light emitting elements 31-3 located, as viewed in plan, at both ends in the longitudinal direction of the laser-processed groove 300 as a target of the kerf check, among the plurality of light emitting elements 31-3 of the oblique illumination 31-2, turns off light emitting elements 31-3 in a direction orthogonal to the longitudinal direction of the laser-processed groove 300, then applies the light 500 from the oblique illumination 31-2, and turns off the coaxial illumination 31-1. Thus, when the control unit 100 carries out the kerf check, the control unit 100 illuminates the workpiece 200 with the oblique illumination 31-2 set such that the light amount of the light 500 in a direction parallel with the extending direction of the laser-processed groove 300 as a target of the kerf check is higher than that of light in a direction orthogonal to the extending direction of the laser-processed groove 300.

When the coaxial illumination 31-1 is turned off, and the oblique illumination 31-2 is set such that the light amount of the light 500 in the direction parallel with the extending direction of the laser-processed groove 300 is higher than that of the light in the direction orthogonal to the extending direction of the laser-processed groove 300, because the saw marks 402 formed on the groove bottom 401 of the cut groove 400 extend along the longitudinal direction of the cut groove 400, the light 500 in the direction parallel with the extending direction of the laser-processed groove 300 is regularly reflected by the saw marks 402, so that the light 500 is not received by the CCD imaging element 33 or the amount of the light 500 received by the CCD imaging element 33 is small. The CCD imaging element 33 therefore photographs the cut groove 400 as a dark part with a low amount of light. The received light amount of the part representing the cut groove 400 at this time is lower than a first threshold value. It is desirable that the first threshold value be a value lower than a central gray level among gray levels of the light amount received by the CCD imaging element 33, and be a gray level of a light amount on a lower side among the gray levels of the light amount received by the CCD imaging element 33.

When the coaxial illumination 31-1 is turned off, and the oblique illumination 31-2 is set such that the light amount of the light 500 in the direction parallel with the extending direction of the laser-processed groove 300 is higher than that of the light in the direction orthogonal to the extending direction of the laser-processed groove 300, because projections and depressions are formed on the groove bottom 301 of the laser-processed groove 300, the light 500 from the oblique illumination 31-2 is diffusely reflected by the groove bottom 301, and received by the CCD imaging element 33. The CCD imaging element 33 therefore photographs the laser-processed groove 300 as a bright part with a high amount of light as compared with the cut groove 400. The light amount of the part representing the laser-processed groove 300 at this time is higher than a second threshold value, which is higher than the first threshold value. It is desirable that the second threshold value be a value higher than the central gray level among the gray levels of the light amount photographed by the CCD imaging element 33, and be a gray level of a light amount on a higher side among the gray levels of the light amount photographed by the CCD imaging element 33.

In addition, the low dielectric constant insulator film 206 remaining in both end portions in the width direction of the planned dividing line 204 diffusely reflects the light of the oblique illumination 31-2, the light amount of the diffusely reflected light being larger than the light amount of the light regularly reflected by the groove bottom 401 of the cut groove 400 and smaller than the light amount of the light diffusely reflected by the groove bottom 301 of the laser-processed groove 300. Therefore, when the coaxial illumination 31-1 is turned off, and the oblique illumination 31-2 is set such that the light amount of the light 500 in the direction parallel with the extending direction of the laser-processed groove 300 is higher than that of the light in the direction orthogonal to the extending direction of the laser-processed groove 300, the CCD imaging element 33 photographs the low dielectric constant insulator film 206 as dark parts with a low amount of light, though the parts are brighter than the cut groove 400.

When the control unit 100 carries out the kerf check, the control unit 100 photographs, by the photographing unit 30, the laser-processed groove 300 illuminated with the oblique illumination 31-2 set to the above-described light amounts and the cut groove 400 formed so as to overlap the laser-processed groove 300, and detects the laser-processed groove 300 displayed brightly with the light 500 diffusely reflected by the projections and depressions of the groove bottom 301 as well as the cut groove 400 displayed more darkly than the laser-processed groove 300 with the groove bottom 401 regularly reflecting the light 500. The control unit 100 calculates the central position in the width direction of the laser-processed groove 300 and the central position in the width direction of the cut groove 400, and controls the Y-axis moving unit 40 at a time of formation of the subsequent cut groove 400 such that a displacement in the Y-axis direction between these positions is zero.

Description will next be made of processing operation of the cutting apparatus 1 according to the first embodiment. In the processing operation, the operator registers processing description information in the control unit 100, the cassette 60 is placed on the cassette elevator 70, the cassette 60 housing the workpiece 200 having the laser-processed groove 300 formed in the planned dividing line 204 and supported by the annular frame 211, and the cutting apparatus 1 starts the processing operation when an instruction to start the processing operation is given from the operator. Incidentally, the operator sets, as the processing description information, light amounts of the respective light emitting elements 31-3 of the oblique illumination 31-2 such that a light amount when the CCD imaging element 33 photographs the cut groove 400 at the time of the kerf check is less than the first threshold value and a light amount when the CCD imaging element 33 photographs the laser-processed groove 300 exceeds the second threshold value.

In the processing operation, the control unit 100 makes the conveying unit extract the workpiece 200 before cutting from the cassette 60 and mount the workpiece 200 on the chuck table 10, and makes the chuck table 10 suck and hold the workpiece 200. The control unit 100 moves the chuck table 10 toward a position below the cutting unit 20 by the X-axis moving unit, positions the workpiece 200 held on the chuck table 10 below the photographing unit 30, and makes the photographing unit 30 image the workpiece 200. The control unit 100 performs image processing such as pattern matching or the like using, as a key pattern, a specific pattern set in a pattern of the device 205, the specific pattern being for use in aligning the planned dividing line 204 of the workpiece 200 held on the chuck table 10 and the cutting blade 22 of the cutting unit 20 with each other, and carries out alignment that adjusts the relative position of the workpiece 200 held on the chuck table 10 and the cutting unit 20.

Then, the control unit 100 moves the cutting blade 22-1 of the one cutting unit 20-1 and the workpiece 200 relative to each other along the planned dividing line 204 by the X-axis moving unit, the Y-axis moving unit 40, the Z-axis moving unit 50, and the rotation-driving source on the basis of the processing description information, and cuts the planned dividing line 204 by the cutting blade 22-1 while supplying cutting water. The cutting unit 20-1 forms the cut groove 400 in the groove bottom 301 of the laser-processed groove 300 formed in each planned dividing line 204.

In parallel with the formation of the cut groove 400 by the cutting blade 22-1 of the one cutting unit 20-1, the control unit 100 forms a division groove not depicted in the figure in the groove bottom 401 of the cut groove 400 by making the cutting blade 22-2 of the other cutting unit 20-2 cut the center in the width direction of the groove bottom 401 of the cut groove 400 to the adhesive tape 210. The control unit 100 divides the workpiece 200 into each individual device 205.

After the control unit 100 sequentially forms cut grooves 400 and division grooves in all of the planned dividing lines 204, and divides the workpiece 200 into each individual device 205, the control unit 100 retracts the chuck table 10 from below the cutting unit 20, and thereafter releases the suction and holding of the chuck table 10. The control unit 100 makes the conveying unit convey the workpiece 200 after the cutting to the cleaning unit 80. The workpiece 200 is cleaned by the cleaning unit 80, and thereafter housed in the cassette 60.

In addition, the control unit 100 carries out the kerf check in predetermined kerf check timings in the processing operation. The kerf check timings are timings of forming cut grooves 400 in each set of a predetermined number of (for example, 5 or 10 or the like) planned dividing lines 204. However, the present invention is not limited to this.

Figure 8:
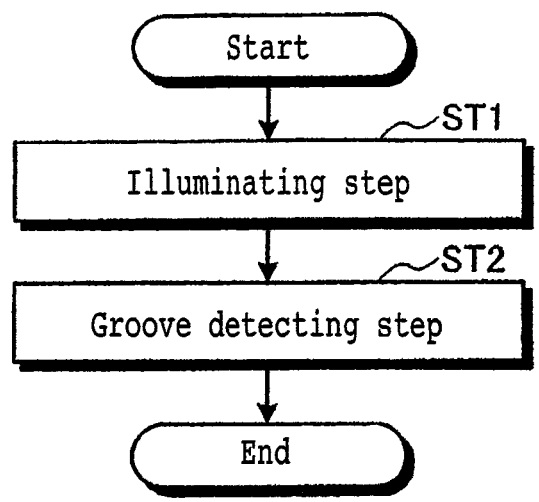
FIG. 8 is a flowchart depicting a flow of a kerf check as a groove detecting method according to the first embodiment.
Figure 9:
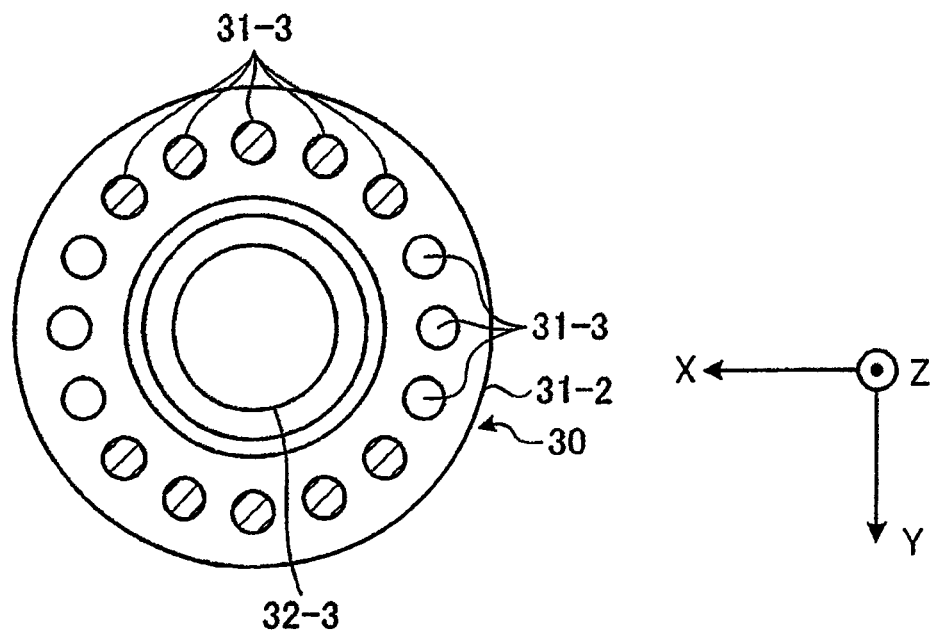
FIG. 9 is a plan view depicting light emitting elements of the oblique illumination which light emitting elements are lit in an illuminating step of the kerf check depicted in FIG. 8.
Figure 10:
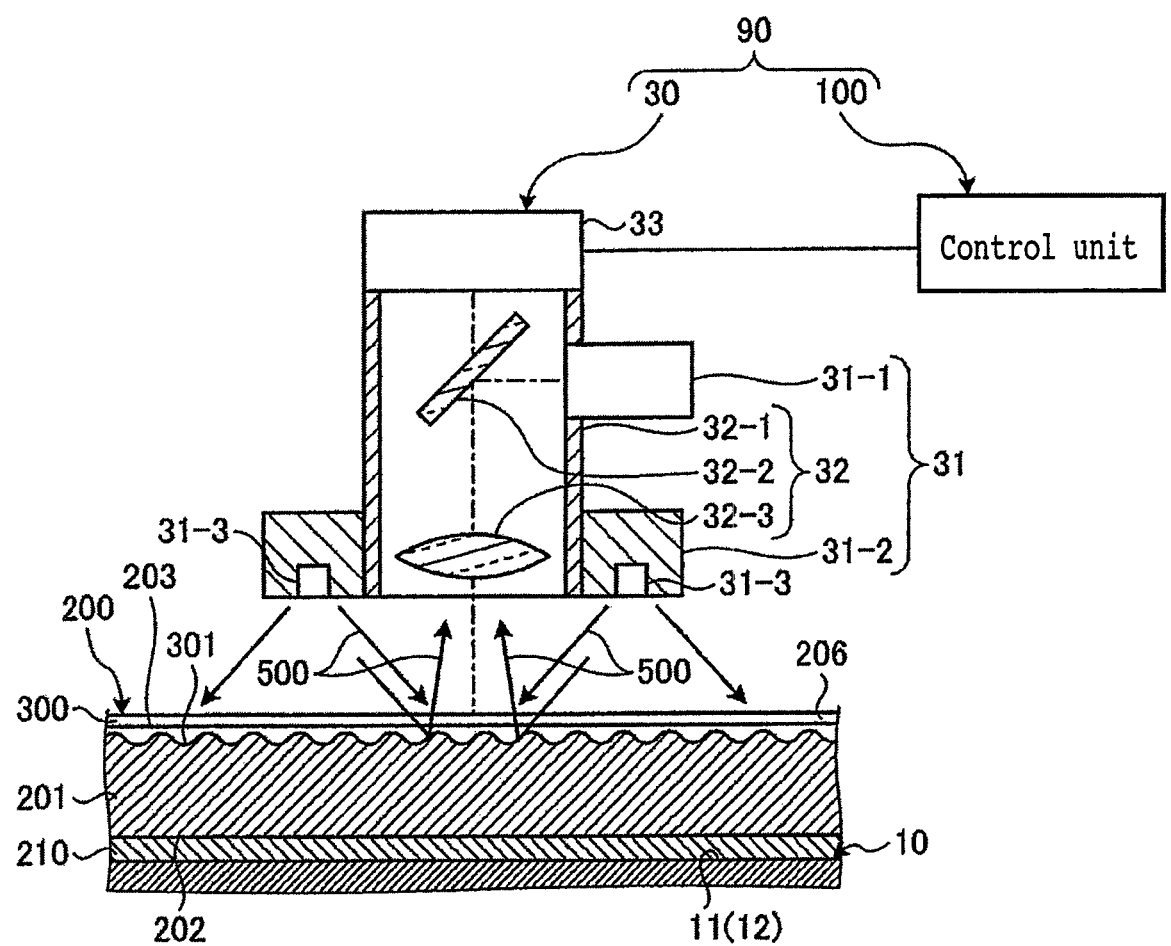
FIG. 10 is a sectional view depicting a state in which light applied by the light emitting elements of the oblique illumination in the illuminating step of the kerf check depicted in FIG. 8 is diffusely reflected by the groove bottoms of laser-processed grooves.
Figure 11:
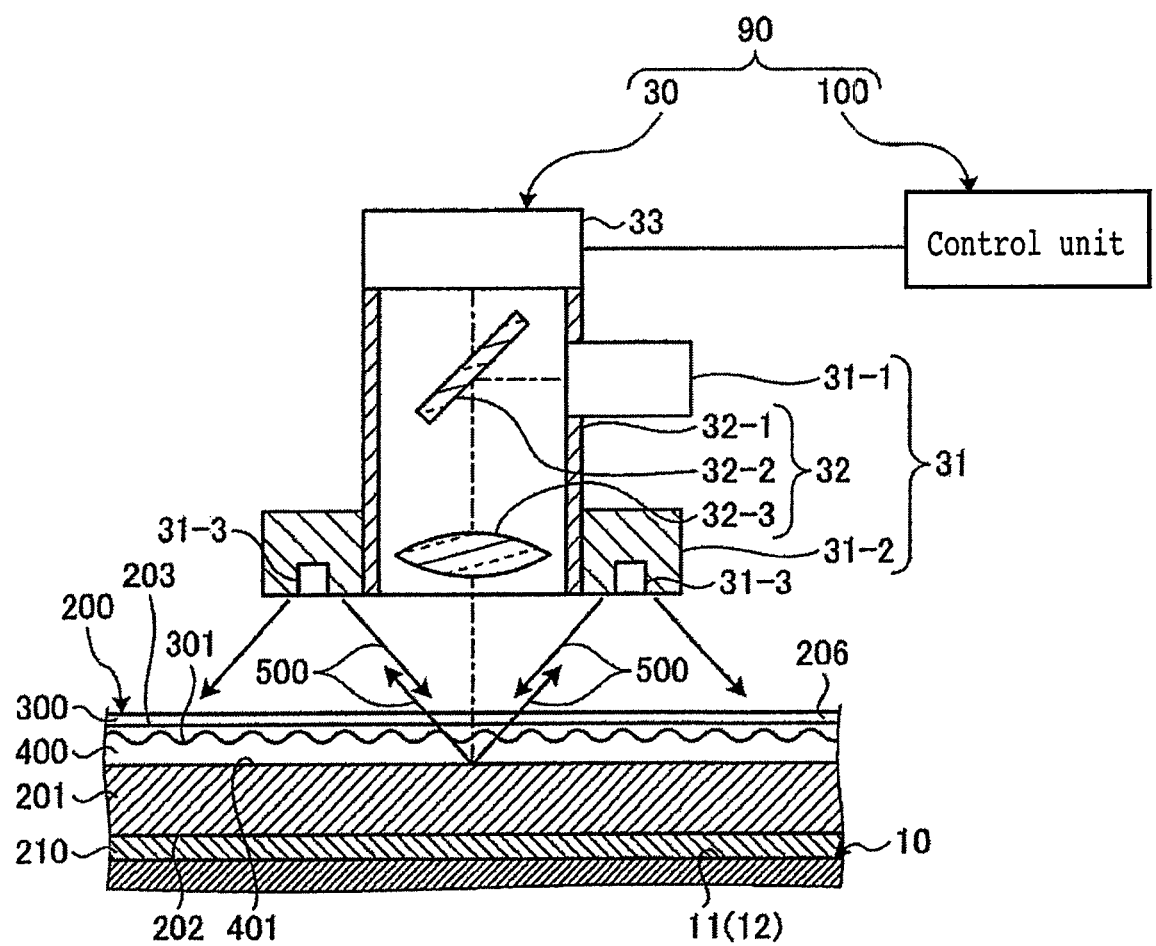
FIG. 11 is a sectional view depicting a state in which the light applied by the light emitting elements of the oblique illumination in the illuminating step of the kerf check depicted in FIG. 8 is regularly reflected by the groove bottom of a cut groove.
Figure 12:
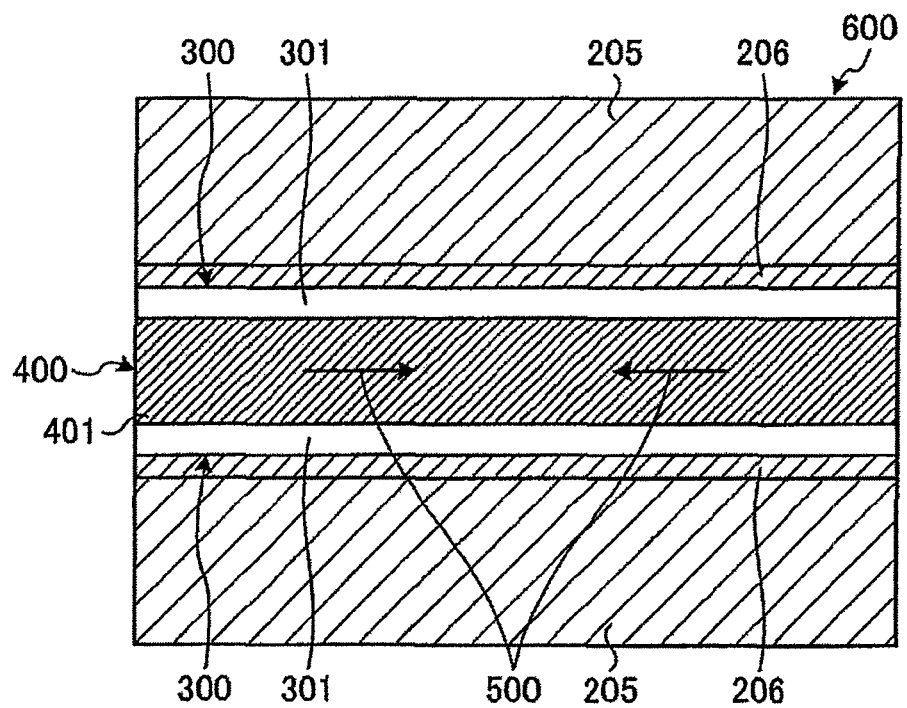
FIG. 12 is a diagram depicting an example of a photographed image photographed by the photographing unit in a groove detecting step of the kerf check depicted in FIG. 8.

The kerf check as the groove detecting method according to the first embodiment will next be described with reference to the drawings. FIG. 8 is a flowchart depicting a flow of the kerf check as the groove detecting method according to the first embodiment. FIG. 9 is a plan view depicting light emitting elements of the oblique illumination which light emitting elements are lit in an illuminating step of the kerf check depicted in FIG. 8. FIG. 10 is a sectional view depicting a state in which light applied by the light emitting elements of the oblique illumination in the illuminating step of the kerf check depicted in FIG. 8 is diffusely reflected by the groove bottoms of laser-processed grooves. FIG. 11 is a sectional view depicting a state in which the light applied by the light emitting elements of the oblique illumination in the illuminating step of the kerf check depicted in FIG. 8 is regularly reflected by the groove bottom of a cut groove. FIG. 12 is a diagram depicting an example of a photographed image photographed by the photographing unit in a groove detecting step of the kerf check depicted in FIG. 8.

The kerf check as the groove detecting method according to the first embodiment is a method of detecting a laser-processed groove 300 formed in the top surface of the workpiece 200 by irradiating the workpiece 200 with a laser beam of a wavelength absorbable by the workpiece 200 and the low dielectric constant insulator film 206. As depicted in FIG. 8, the kerf check includes an illuminating step ST1 and a groove detecting step ST2.

The illuminating step ST1 is a step in which the chuck table 10 holds the workpiece 200 having the laser-processed groove 300 formed therein and the oblique illumination 31-2 that performs irradiation from a direction parallel with the extending direction of the laser-processed groove 300 as viewed in plan illuminates the laser-processed groove 300. In the illuminating step ST1 in the first embodiment, the control unit 100 makes the X-axis moving unit, the Y-axis moving unit 40, and the like oppose the photographing unit 30 to a preset imaging position of the planned dividing line 204 of the workpiece 200 shortly after the formation of the cut groove 400, turns off the coaxial illumination 31-1, and makes each of the light emitting elements 31-3 of the oblique illumination 31-2 emit light with a light amount set in the processing description information. Incidentally, the workpiece 200 shortly after the formation of the cut groove 400 is held on the chuck table 10 before the formation of the cut groove 400, and the planned dividing line 204 shortly after the formation of the cut groove 400 is parallel with the X-axis direction.

In addition, in the illuminating step ST1 in the first embodiment, as depicted in FIG. 9, the control unit 100 turns on light emitting elements 31-3 represented by a white background in FIG. 9 which light emitting elements are located in both end portions in the direction parallel with the planned dividing line 204 as a target of the kerf check shortly after the formation of the cut groove 400 among the plurality of light emitting elements 31-3 of the oblique illumination 31-2, turns off light emitting elements 31-3 represented by hatching in FIG. 9 which light emitting elements are located in both end portions in the direction orthogonal to the planned dividing line 204 as a target of the kerf check, and thus illuminates the workpiece 200 with the oblique illumination 31-2 from the direction parallel with the extending direction of the laser-processed groove 300 as viewed in plan.

In the illuminating step ST1, because projections and depressions are formed on the groove bottom 301 of the laser-processed groove 300, as depicted in FIG. 10, the light 500 from the light emitting elements 31-3 of the oblique illumination 31-2 is diffusely reflected from the groove bottom 301, and a part of the light 500 is received by the CCD imaging element 33 through the condensing lens 32-3. In addition, in the illuminating step ST1, because the saw marks 402 of the groove bottom 401 of the cut groove 400 extend in parallel with the longitudinal direction of the cut groove 400, as depicted in FIG. 11, the light 500 from the light emitting elements 31-3 of the oblique illumination 31-2 is regularly reflected from the groove bottom 401, and is thus hardly received by the CCD imaging element 33 through the condensing lens 32-3. After the illuminating step ST1, the kerf check proceeds to the groove detecting step ST2.

The groove detecting step ST2 is a step of photographing the illuminated laser-processed groove 300 by the photographing unit 30, and detecting the laser-processed groove 300 diffusely reflecting the light 500 of the oblique illumination 31-2 by the projections and depressions of the groove bottom 301 from a photographed image 600 (an example of which is depicted in FIG. 12) obtained by the photographing. In addition, in the groove detecting step ST2, the control unit 100 makes the photographing unit 30 photograph the laser-processed groove 300 and the cut groove 400 that is formed in a position overlapping the laser-processed groove 300 along the laser-processed groove 300, and the control unit 100 detects the laser-processed groove 300 and the cut groove 400 that regularly reflects the light 500 of the oblique illumination 31-2 by the groove bottom 401 from the photographed image 600.

In the groove detecting step ST2, the control unit 100 detects, as the cut groove 400, a part whose light amount is less than the first threshold value (which part is represented by dense hatching in FIG. 12) in the photographed image 600 photographed by the photographing unit 30, and detects, as the laser-processed groove 300, a part whose light amount exceeds the second threshold value (which part is represented by a white background in FIG. 12) in the photographed image 600. The control unit 100 calculates the central position in the width direction of the laser-processed groove 300 and the central position in the width direction of the cut groove 400, and then ends the kerf check. The control unit 100 controls the Y-axis moving unit 40 at a time of formation of the subsequent cut groove 400 such that a displacement in the Y-axis direction between the central position in the width direction of the laser-processed groove 300 and the central position in the width direction of the cut groove 400 is zero.

Utilizing a fact that projections and depressions are formed on the groove bottom 301 of the laser-processed groove 300, and that the saw marks 402 along the longitudinal direction of the cut groove 400 are formed on the groove bottom 401 of the cut groove 400, when the cutting apparatus 1 according to the first embodiment carries out the kerf check, the cutting apparatus 1 in the illuminating step ST1 turns on light emitting elements 31-3 located in both end portions in the longitudinal direction of the laser-processed groove 300 among the plurality of light emitting elements 31-3 of the oblique illumination 31-2, and turns off light emitting elements 31-3 located in both end portions in the direction orthogonal to the longitudinal direction of the laser-processed groove 300. Therefore, when the cutting apparatus 1 carries out the kerf check, the cutting apparatus 1 uses the light 500 of the oblique illumination 31-2 which light is in the direction parallel with the longitudinal direction of the laser-processed groove 300 as viewed in plan. The light 500 of the oblique illumination 31-2 is diffusely reflected by the laser-processed groove 300, and is regularly reflected by the cut groove 400. As a result, when the cutting apparatus 1 carries out the kerf check, in the photographed image 600 photographed in the groove detecting step ST2, the laser-processed groove 300 is photographed brightly, and the cut groove 400 is photographed darkly. The cutting apparatus 1 can therefore detect the respective positions of the laser-processed groove 300 and the cut groove 400 easily by image processing. Hence, when the cutting apparatus 1 according to the first embodiment carries out the kerf check, the cutting apparatus 1 can suppress detection of the laser-processed groove 300 and the cut groove 400 in a confused manner, and can suppress a displacement of the cut groove 400 from the center in the width direction of the laser-processed groove 300.

Second Embodiment

Figure 13:
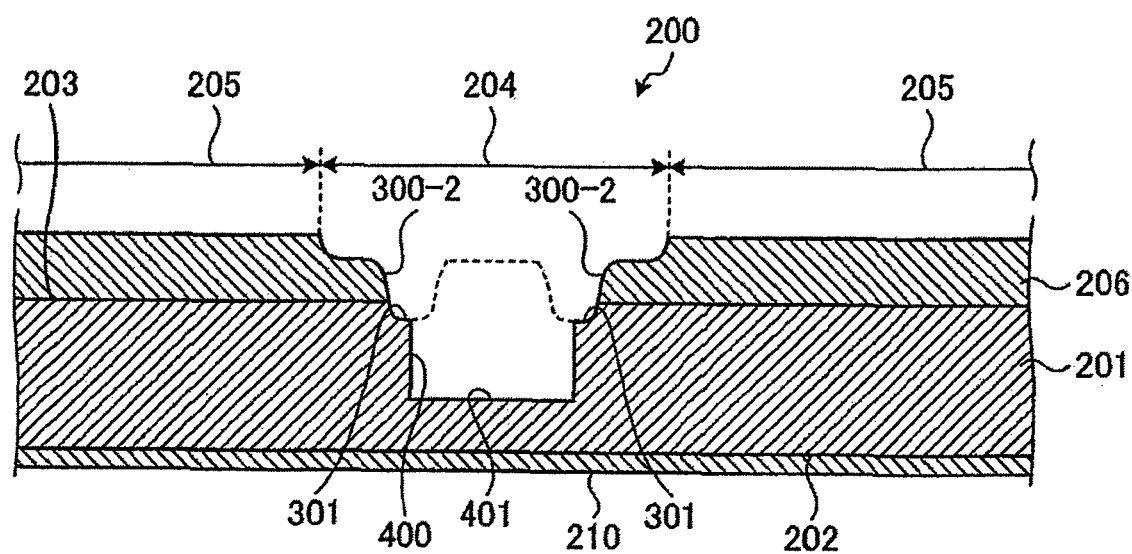
FIG. 13 is a sectional view of a workpiece having a cut groove formed in a region including at least some of the groove bottoms of laser-processed grooves as a target of a kerf check as a groove detecting method according to a second embodiment.

A cutting apparatus and a groove detecting method according to a second embodiment of the present invention will be described with reference to the drawings. FIG. 13 is a sectional view of a workpiece having a cut groove formed in a region including at least some of the groove bottoms of laser-processed grooves as a target of a kerf check as the groove detecting method according to the second embodiment. Incidentally, in FIG. 13, the same parts as in the first embodiment are identified by the same reference numerals, and description thereof will be omitted.

The cutting apparatus 1 according to the second embodiment forms a cut groove 400 in a center in a width direction of the planned dividing line 204 of the workpiece 200 in which two laser-processed grooves 300-2 at both ends in a width direction of the planned dividing line 204 are formed along the planned dividing line 204, as depicted in FIG. 13. Incidentally, the cutting apparatus 1 according to the second embodiment forms the cut groove 400 in a region including at least some of groove bottoms 301 of both the laser-processed grooves 300-2. As in the first embodiment, the kerf check as the groove detecting method according to the second embodiment includes an illuminating step ST1 and a groove detecting step ST2.

When the cutting apparatus 1 according to the second embodiment carries out the kerf check, the cutting apparatus 1 in the illuminating step ST1 turns on light emitting elements 31-3 located in both end portions in the longitudinal direction of the laser-processed grooves 300-2 among a plurality of light emitting elements 31-3 of an oblique illumination 31-2, and turns off light emitting elements 31-3 located in both end portions in a direction orthogonal to the longitudinal direction of the laser-processed grooves 300-2. Therefore, as in the first embodiment, when the cutting apparatus 1 according to the second embodiment carries out the kerf check, the cutting apparatus 1 can suppress detection of the laser-processed grooves 300-2 and the cut groove 400 in a confused manner, and can suppress a displacement of the cut groove 400 from a center in the width direction of the laser-processed grooves 300-2.

Next, the inventors of the present invention confirmed effects of the first embodiment. In the confirmation, a comparison was made between the photographed image 600 depicted in FIG. 12, a photographed image 600-1 in a first comparative example, the photographed image 600-1 being depicted in FIG. 14, and a photographed image 600-2 in a second comparative example, the photographed image 600-2 being depicted in FIG. 15.

Figure 14:
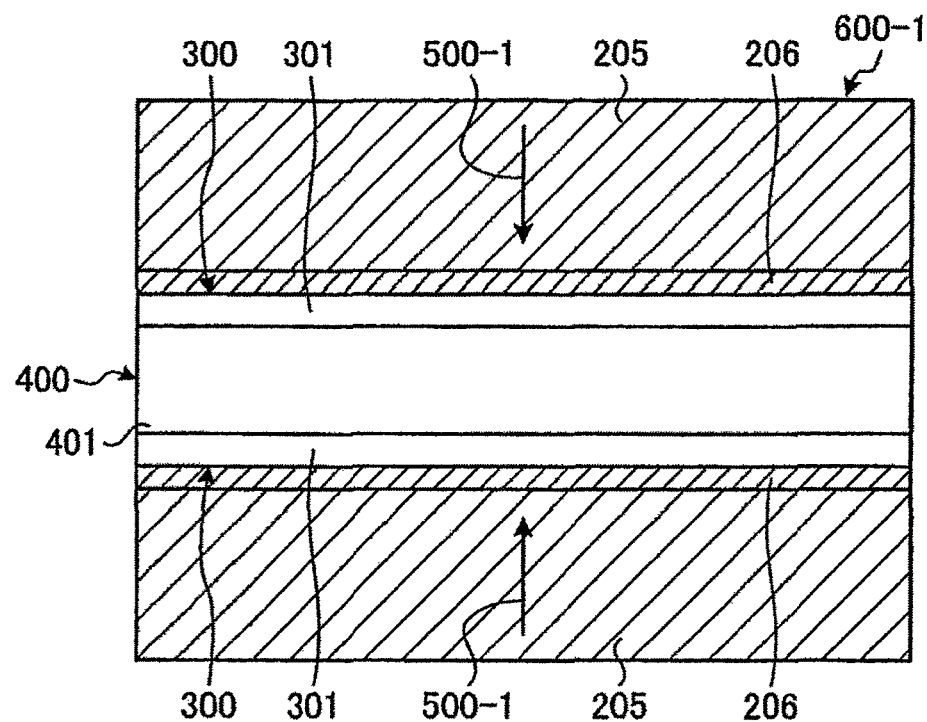
FIG. 14 is a diagram depicting an example of a photographed image photographed by the photographing unit in a groove detecting step of a kerf check in a first comparative example.
Figure 15:
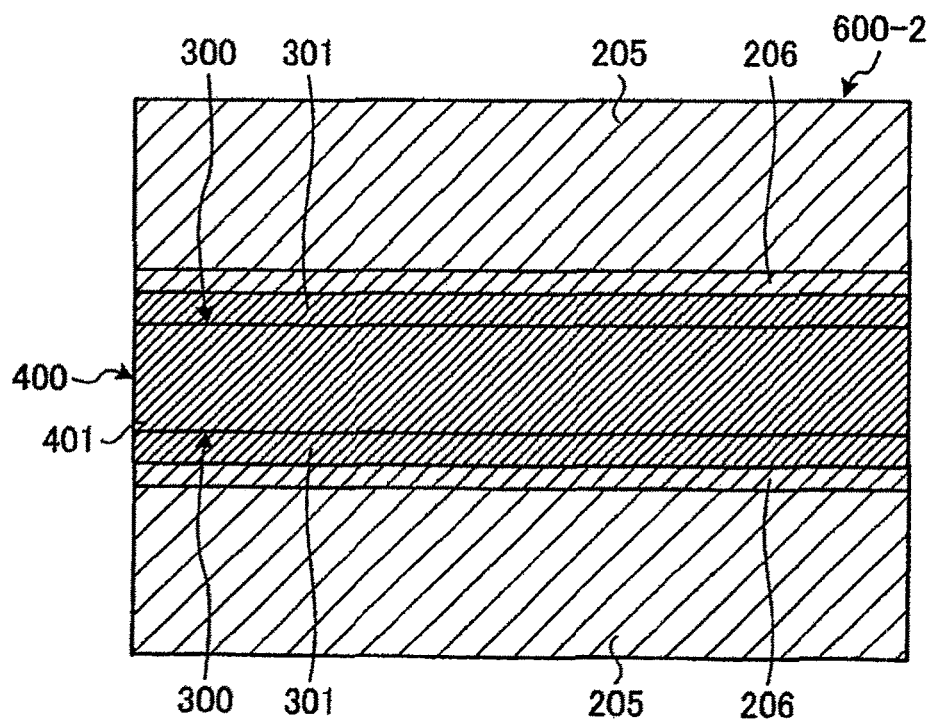
FIG. 15 is a diagram depicting an example of a photographed image photographed by the photographing unit in a groove detecting step of a kerf check according to a second comparative example.

FIG. 14 is a diagram depicting an example of a photographed image photographed by the photographing unit in the groove detecting step of a kerf check in the first comparative example. FIG. 15 is a diagram depicting an example of a photographed image photographed by the photographing unit in the groove detecting step of a kerf check in the second comparative example.

In the first comparative example, in the illuminating step ST1 when the kerf check was carried out, the coaxial illumination 31-1 was turned off, light emitting elements 31-3 represented by a white background in FIG. 9 which light emitting elements are located in both end portions in the longitudinal direction of the laser-processed groove 300 among the plurality of light emitting elements 31-3 of the oblique illumination 31-2 were turned off, light emitting elements 31-3 represented by hatching in FIG. 9 which light emitting elements are located in both end portions in the direction orthogonal to the longitudinal direction of the laser-processed groove 300 were turned on, and light 500-1 orthogonal to the laser-processed groove 300 as viewed in plan was applied from the oblique illumination 31-2. In the second comparative example, in the illuminating step ST1 when the kerf check was carries out, the coaxial illumination 31-1 was turned on, and all of the light emitting elements 31-3 of the oblique illumination 31-2 were turned off.

In the first comparative example, it is difficult to detect the position of the cut groove 400, because the light amounts of parts representing both the groove bottom 301 of the laser-processed groove 300 and the groove bottom 401 of the cut groove 400 in the photographed image 600-1 (depicted in FIG. 14) photographed by the photographing unit 30 exceed the second threshold value. Hence, it has become clear that when the illuminating step ST1 turns off the coaxial illumination 31-1, turns off light emitting elements 31-3 located in both end portions in the longitudinal direction of the laser-processed groove 300 among the plurality of light emitting elements 31-3 of the oblique illumination 31-2, and turns on light emitting elements 31-3 located in both end portions in the direction orthogonal to the longitudinal direction of the laser-processed groove 300, the light 500-1 of the oblique illumination 31-2 is diffusely reflected by both the groove bottom 301 of the laser-processed groove 300 and the groove bottom 401 of the cut groove 400, and it is thus difficult to detect the cut groove 400.

The second comparative example is a case where only the coaxial illumination 31-1 is turned on. Even when the light amount of the coaxial illumination 31-1 is adjusted, there is a small difference in light amount between the groove bottom 401 of the cut groove 400 and the groove bottom 301 of the laser-processed groove 300 in the photographed image 600-2 (depicted in FIG. 15) photographed by the photographing unit 30, and the light amounts of parts representing both the groove bottom 401 of the cut groove 400 and the groove bottom 301 of the laser-processed groove 300 are less than the first threshold value. It is thus difficult to detect the position of the laser-processed groove 300. Hence, it has become clear that when the illuminating step ST1 turns on the coaxial illumination 31-1, and turns off all of the light emitting elements 31-3 of the oblique illumination 31-2, the light of the coaxial illumination 31-1 is diffusely reflected by both the low dielectric constant insulator film 206 and the groove bottom 301 of the laser-processed groove 300, and it is thus difficult to detect the laser-processed groove 300.

In contrast to the first comparative example and the second comparative example, the cutting apparatus 1 according to the first embodiment in the illuminating step ST1 turns off the coaxial illumination 31-1, turns on light emitting elements 31-3 located in both end portions in the longitudinal direction of the laser-processed groove 300 among the plurality of light emitting elements 31-3 of the oblique illumination 31-2, and turns off light emitting elements 31-3 located in both end portions in the direction orthogonal to the longitudinal direction of the laser-processed groove 300. The cutting apparatus 1 thereby photographs the laser-processed groove 300 brightly, and photographs the cut groove 400 darkly, as depicted in FIG. 12. It has therefore become clear that the cutting apparatus 1 can detect both the laser-processed groove 300 and the cut groove 400.

It is to be noted that the present invention is not limited to the foregoing embodiments. That is, the present invention can be modified and carried out in various manners without departing from the gist of the present invention. For example, while in the first embodiment, the coaxial illumination 31-1 is turned off, and each of the light emitting elements 31-3 of the oblique illumination 31-2 is made to emit light with a light amount set in the processing description information, the present invention may make the coaxial illumination 31-1 emit light with a low light amount as compared with the oblique illumination 31-2 in the illuminating step ST1.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A cutting apparatus for forming, along a laser-processed groove formed in a top surface of a workpiece by a laser beam irradiating the workpiece, the workpiece having a plan view of the top surface orthogonal to the top surface, a cut groove in a position overlapping the laser-processed groove, the cutting apparatus comprising:
- a cutting unit configured to cut the workpiece held on a chuck table by a cutting blade mounted on a spindle; and
- a groove detecting unit including a camera photographing the workpiece held on the chuck table;
- the groove detecting unit photographing, by the camera, the laser-processed groove and the cut groove formed so as to overlap the laser-processed groove, the laser-processed groove and the cut groove being illuminated by an oblique illumination set such that a light amount of light in a direction parallel with an extending direction of the laser-processed groove as viewed in plan is higher than a light amount of light in a direction orthogonal to the extending direction of the laser-processed groove as viewed in plan, and detecting, from a photographed image, the laser-processed groove displayed brightly with the light diffusely reflected by projections and depressions of a groove bottom of the laser-processed groove as well as the cut groove displayed more darkly than the laser-processed groove with the light regularly reflected by a groove bottom of the cut groove.

2. The cutting apparatus according to claim 1, wherein the oblique illumination set is a ring illumination set annularly around an outer circumference of a condensing lens included in the camera, and has an illumination direction selecting function so as to apply light from the direction parallel with the extending direction of the laser-processed groove as viewed in plan.

3. A groove detecting method for detecting a laser-processed groove formed in a top surface of a workpiece by irradiating the workpiece with a laser beam, wherein the workpiece has a plan view of the top surface orthogonal to the top surface, the groove detecting method comprising:
- an illuminating step of holding, by a chuck table, the workpiece in which the laser-processed groove is formed, and illuminating the laser-processed groove with an oblique illumination performing irradiation from a direction parallel with an extending direction of the laser-processed groove as viewed in plan; and
- a groove detecting step of photographing the illuminated laser-processed groove by a camera, and detecting the laser-processed groove diffusely reflecting light of the oblique illumination by projections and depressions of a groove bottom of the laser-processed groove from a photographed image obtained by the photographing.

4. The groove detecting method according to claim 3, wherein in the groove detecting step, a cut groove formed along the laser-processed groove and in a position overlapping the laser-processed groove is photographed, and the cut groove regularly reflecting the light of the oblique illumination by a groove bottom of the cut groove is detected.

* * * * *